（12）United States Patent
Jung

(10) Patent No.: US 8,018,257 B2
(45) Date of Patent: Sep. 13, 2011

(54) CLOCK DIVIDER AND CLOCK DIVIDING METHOD FOR A DLL CIRCUIT

(75) Inventor: Hea Suk Jung, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/771,545

(22) Filed: Apr. 30, 2010

(65) Prior Publication Data

US 2010/0208542 A1 Aug. 19, 2010

Related U.S. Application Data

(63) Continuation of application No. 10/701,306, filed on Nov. 4, 2003, now abandoned.

(30) Foreign Application Priority Data

Apr. 23, 2003 (KR) .................. 10-2003-0025770

(51) Int. Cl.
*H03L 7/00* (2006.01)

(52) U.S. Cl. ...................................... 327/153

(58) Field of Classification Search .................. None
See application file for complete search history.

(56) References Cited

U.S. PATENT DOCUMENTS

2003/0215040 A1* 11/2003 Bell et al. ................. 375/376

* cited by examiner

*Primary Examiner* — Lincoln Donovan
*Assistant Examiner* — Khareem E Almo
(74) *Attorney, Agent, or Firm* — Ladas & Parry LLP

(57) ABSTRACT

A clock divider for a DLL circuit reduces power consumption by reducing the number of times of performing phase comparison in the DLL circuit when a synchronous memory device is in a power-down mode. The clock divider includes M dividers and a power-down controller for receiving an output signal of the (M−1)-th divider and an output signal of the M-th divider and selectively outputting the output signals. Each divider divides the clock signal frequency inputted to the divider by ½. The output signal frequency of the power-down controller is obtained by dividing the frequency of the clock signal inputted to the first divider into $\frac{1}{2}^M$ or $\frac{1}{2}^{(M-1)}$ depending on the logic level of a control signal, which is indicative of the power down mode of the memory device.

6 Claims, 5 Drawing Sheets

CLOCK DIVIDER AND CLOCK DIVIDING METHOD FOR A DLL CIRCUIT

BACKGROUND OF THE INVENTION

1. Field of the Invention

The present invention relates to a DLL (Delay Lock Loop) circuit, and more particularly to a clock divider and a clock dividing method for a DLL circuit which can reduce a power consumption when a synchronous memory device is kept in a power-down mode that corresponds to a low power consumption state.

2. Description of the Prior Art

As generally known in the art, in a synchronous memory device (hereinafter referred to as a memory device), an internal clock signal is used in order to adjust an operation timing of the memory device and to prevent malfunction of the memory device. In the case that an externally inputted clock is used inside a typical memory device, a time delay occurs. A DLL (Delay Lock Loop) circuit is a circuit which synchronizes a phase of an internal clock of the memory device with a phase of the externally inputted clock in order to control such a time delay.

FIG. 1 is a block diagram of a general DLL circuit.

As illustrated in FIG. 1, the DLL circuit includes a clock buffer unit 100 for receiving an external clock signal, a clock divider 110 for dividing an output signal of the clock buffer unit 100, a delay unit 130 and a delay model 150 for delaying an output signal of the clock divider 110 for a predetermined time, a phase comparator 120 for comparing a phase of an output signal of the delay model 150 with a phase of the output signal of the clock divider 110, and a DLL signal driving unit 140 for receiving output signals of the delay unit 130 and outputting an internal clock signal used in the memory device.

Clock buffers 101 and 102 of the clock buffer unit 100 are buffer circuits that convert a potential level of the externally inputted clock signals CLK and /CLK into a potential level used inside the memory device. Generally, the clock buffers of the memory device are activated by a clock enable signal CKE (not illustrated).

The clock divider 110 receives and divides the output signal Rise_clk of the clock buffer 102. The clock divider 110 divides the frequency of the clock signal Rise_clk into $1/2^M$ (here, M is the number of dividers), and outputs two output signals S2 and S3. The output signal S2 is an inverted signal of the output signal S3. The output signal S2 of the clock divider 110 is applied to the phase comparator 120 after being delayed for a predetermined time through a third delay line and the delay model 150. For reference, the delay model 150 is a dummy delay unit for compensating for a phase difference between the output signal S3 and an output signal (i.e., feedback signal).

The phase comparator 70 compares the phase of the output signal S3 of the clock divider with the phase of the output signal (i.e., feedback signal) of the delay model 150, and reduces the time difference between the two output signals.

The output signal of the phase comparator 120 is applied to a shift controller of the delay unit. If the phase difference is 0, the shift controller outputs a DLL_lockb signal so that a shift register maintains its present state. On the contrary, if there exists any phase difference, the shift controller controls the shift register to adjust a delay time of the third delay line. An output signal SR of the shift controller makes the shift register shift to the right, and another output signal SL of the shift controller makes the shift register shift to the left. First and second delay lines delay output signals Rise_clk and Fall_clk of the clock buffers 101 and 102 for a predetermined time under the control of the shift controller, and provide corresponding output signals, i.e., an input rising clock irclk and an input falling clock ifclk. The first to third delay lines are composed of a logic circuit having a very short delay time to reduce a jitter.

The first and second DLL signal drivers of the DLL signal driving unit 140 are buffers for providing DLL clock signals used in the memory device. Accordingly, output signals, i.e., a rising clock_dll rclk_dll and a falling clock_dll fclk_dll, of the first and second DLL signal drivers 140 are used as the internal clock signals.

The DLL circuit compensates for the time difference between the externally inputted clock signal CLK and the internal clock signal. Accordingly, the output signals, i.e., the rising clock_dll rclk_dll and the falling clock_dll fclk_dll, of the first and second DLL signal drivers, which are the internal clock signals of the memory device, are synchronized with the external clock CLK through the DLL circuit.

FIG. 2 illustrates a circuit diagram of the clock divider illustrated in FIG. 1.

The clock divider 110 includes first to third dividers 200, 201 and 220, which are connected in series. That is, an output signal of the first divider 200 is applied to an input terminal of the second divider 210, and an output signal of the second divider is applied to an input terminal of the third divider 220. In FIG. 2, the signal S1 corresponds to the signal Rise_clk in FIG. 1, and the signal S2 is an inverted signal of the signal S3.

The first divider outputs a clock signal A, which is obtained by dividing the frequency of the clock input signal S1 into ½. The second divider outputs a clock signal B, which is obtained by dividing the frequency of the output signal A of the first divider into ½. Accordingly, the frequency of the output signal B of the second divider is ¼ of the frequency of the clock input signal S1. The third divider outputs a clock signal C, which is obtained by dividing the frequency of the output signal B of the second divider into ½. Accordingly, the frequency of the output signal C of the third divider is ⅛ of the frequency of the clock input signal S1. This clock divider is called a ⅛-clock divider. As shown in FIG. 3, the duty rates of the output signals of the first to third dividers are not identical, but the duty rates can be modified if needed.

The respective divider circuit of FIG. 2 is composed of NAND gates, but many modifications thereof can be made by those skilled in the art.

FIG. 3 is a timing diagram of the clock divider illustrated in FIG. 2.

As show in FIG. 3, the period of the clock signal S1 applied to the first divider is tCK. The frequency of the output signal A of the first divider is ½ of the frequency of the clock signal S1, and the width of the high-level pulse signal is the same as the period of the clock signal S1. Also, the ⅛-clock divider outputs an output signal S2 of which the width of a low-level pulse signal is tCK. As show in FIG. 3, the output signals S2 and S3 of the conventional clock divider are not controlled by an externally inputted clock enable signal CKE, and thus they are processed irrespective of the state of the memory device. Accordingly, even in the case of a power-down mode in which the power consumption of the memory device is reduced, the output waveform of the clock divider becomes the same as that in a non-power-down mode of the memory device. For this reason, the DLL circuit consumes the same amount of current as that in the non-power-down mode even though the memory device is in the power-down mode.

Generally, in the case that the memory device is in the power-down mode, the power supply of the memory device is stabilized. Thus, it does not cause big problem even if the number of times of phase comparison is reduced in the power-down mode in comparison to that in the non-power-down mode.

As described above, the conventional DLL circuit has the drawbacks that even if the memory device is in the power-down mode, the DLL circuit generates the internal clock signal, which is to be used inside the memory device, in the same manner as in the non-power-down mode, and this causes an unnecessary current consumption.

SUMMARY OF THE INVENTION

Accordingly, the present invention has been made to solve the above-mentioned problems occurring in the prior art, and an object of the present invention is to provide a clock divider for a DLL circuit which can reduce the power consumption by reducing the number of times of phase comparison in the DLL circuit when a memory device is in a power-down mode.

In order to accomplish this object, there is provided a clock divider for a DLL (Delay Lock Loop) circuit which can reduce the number of times of phase comparison in a phase comparator by dividing an external input clock into $\frac{1}{2}^{(M-1)}$ (where, M is the number of dividers) in the case that a memory device is in a non-power-down mode and by dividing the external input clock into $\frac{1}{2}^{M}$ in the case that the memory device is in a power-down mode.

In one aspect of the present invention, there is provided a clock divider for a DLL circuit comprising M dividers connected in series, and a power-down controller for receiving an output signal of the (M−1)-th divider and an output signal of the M-th divider and selectively outputting the output signals, wherein the respective dividers divide a frequency of a clock signal inputted to the respective dividers into ½, and the output signal of the power-down controller has a frequency obtained by dividing the frequency of the clock signal inputted to the first divider into $\frac{1}{2}^{M}$ or $\frac{1}{2}^{(M-1)}$ in accordance with a logic level of a control signal.

In the present invention, if the logic level of the control signal is a first state (high level), the output signal of the power-down controller becomes the output of the (M−1)-th divider, and if the logic level of the control signal is a second state (low level), the output signal of the power-down controller becomes the output of the M-th divider.

In the present invention, a pulse width of a high-level state of the output signal of the first divider is the same as a period of the input signal of the first divider, and a pulse width of a low-level state of output signals of the second to M-th dividers is the same as the period of the input signal of the first divider.

In another aspect of the present invention, there is provided a clock dividing method for a DLL circuit of a synchronous memory device for synchronization of an external input clock with an internal input clock, the method comprising the steps of selectively outputting an output signal of a (M−1)-th divider and an output signal of an M-th divider among M dividers, connected in series, for respectively dividing a frequency of the input clock signal into ½.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
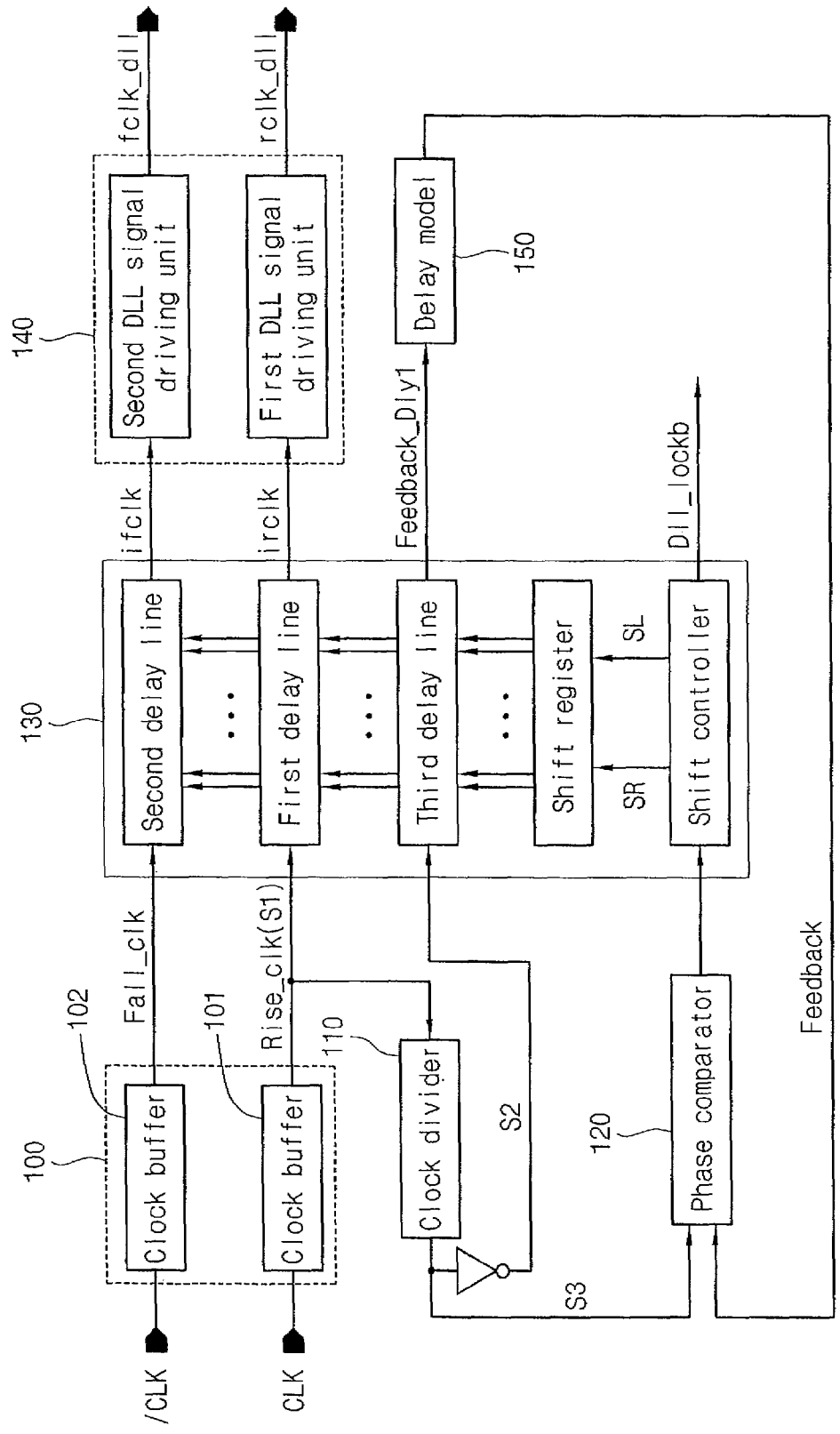
FIG. 1 is a block diagram of a general DLL circuit.
Figure 2:
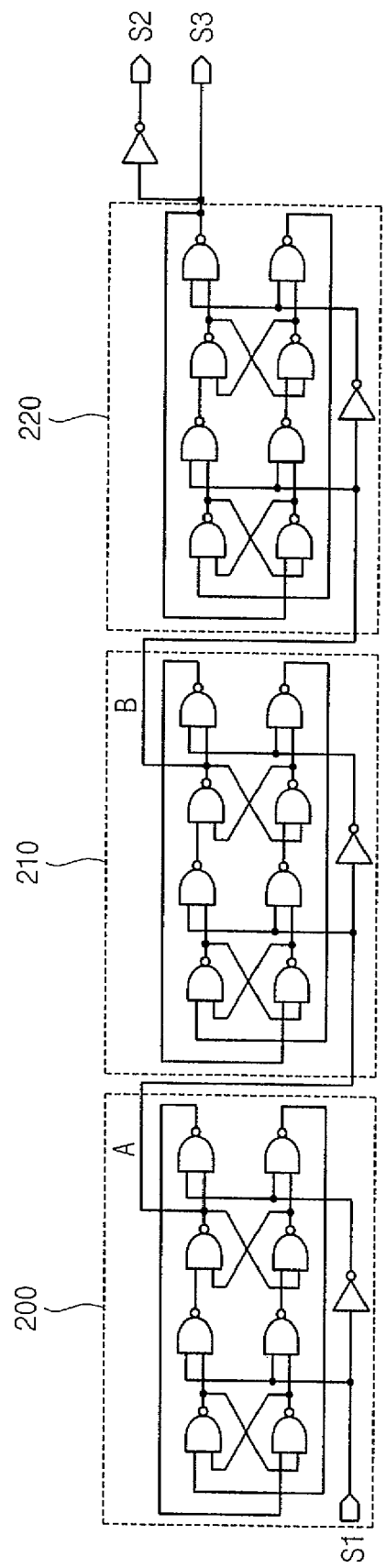
FIG. 2 is a circuit diagram of a clock divider illustrated in FIG. 1.
Figure 3:
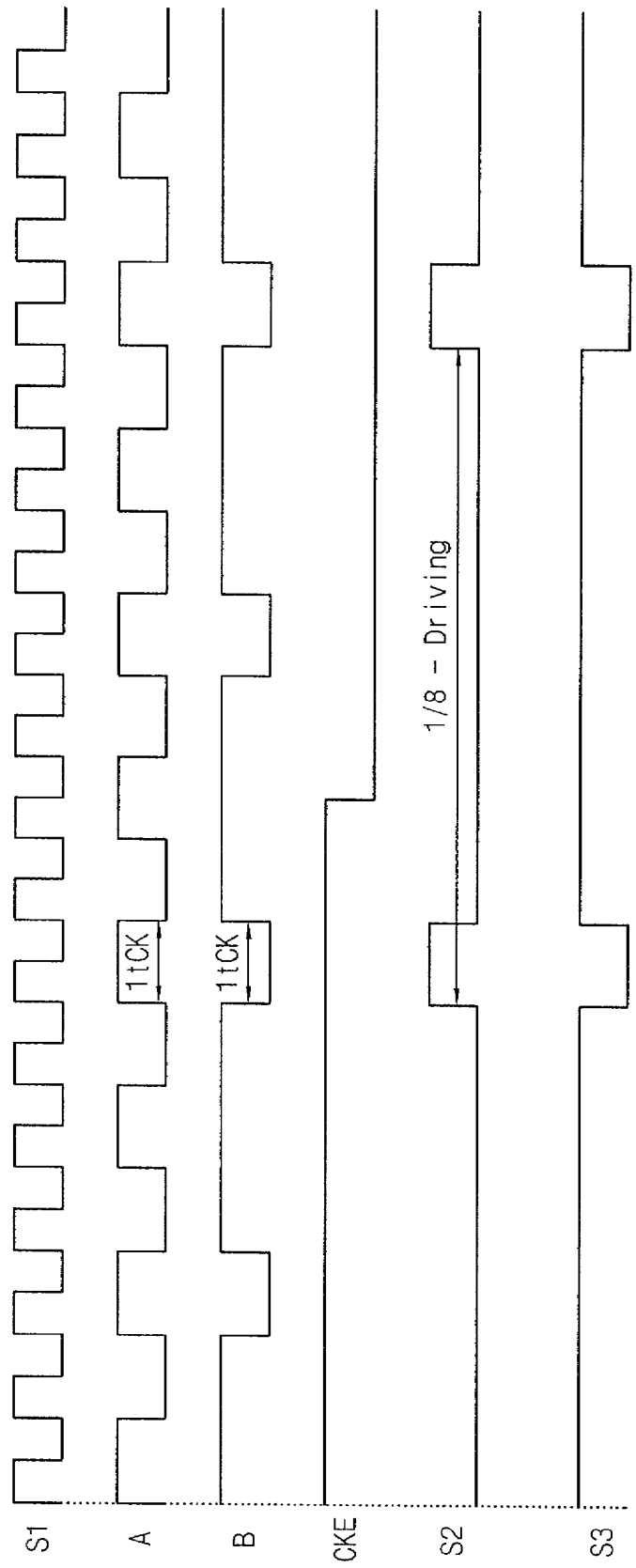
FIG. 3 is a timing diagram of the clock divider illustrated in FIG. 2.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 4:
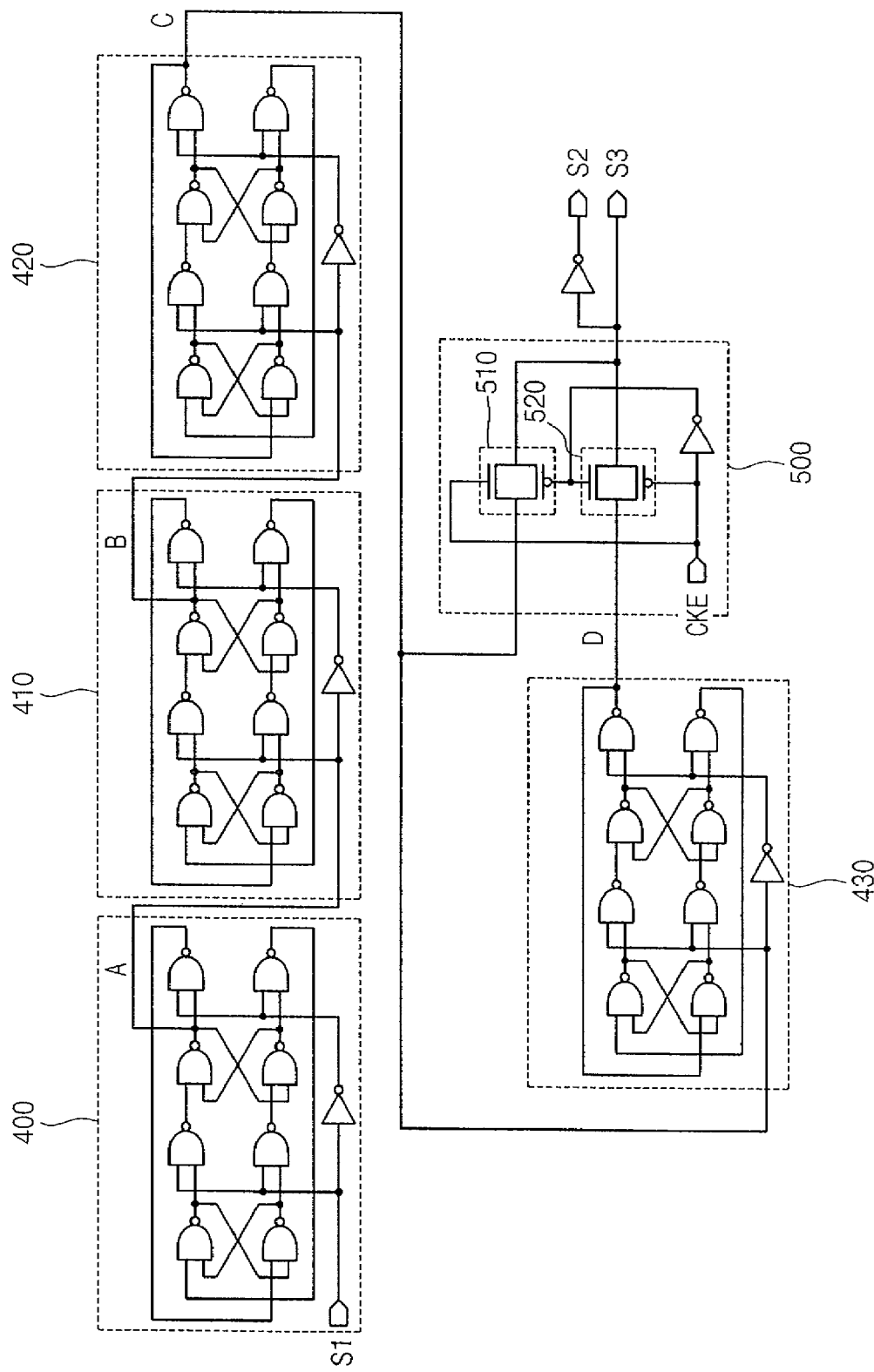
FIG. 4 is a circuit diagram of a clock divider according to the present invention.

FIG. 4 is a circuit diagram of a clock divider according to the present invention.

As illustrated in FIG. 4, the clock divider for a DLL circuit according to the present invention includes first to fourth dividers 400, 410, 420 and 430 and a power-down controller 500.

The first to fourth dividers have the same construction using NAND gates. For reference, diverse modifications of the clock divider can be made by those skilled in the art.

Figure 5:
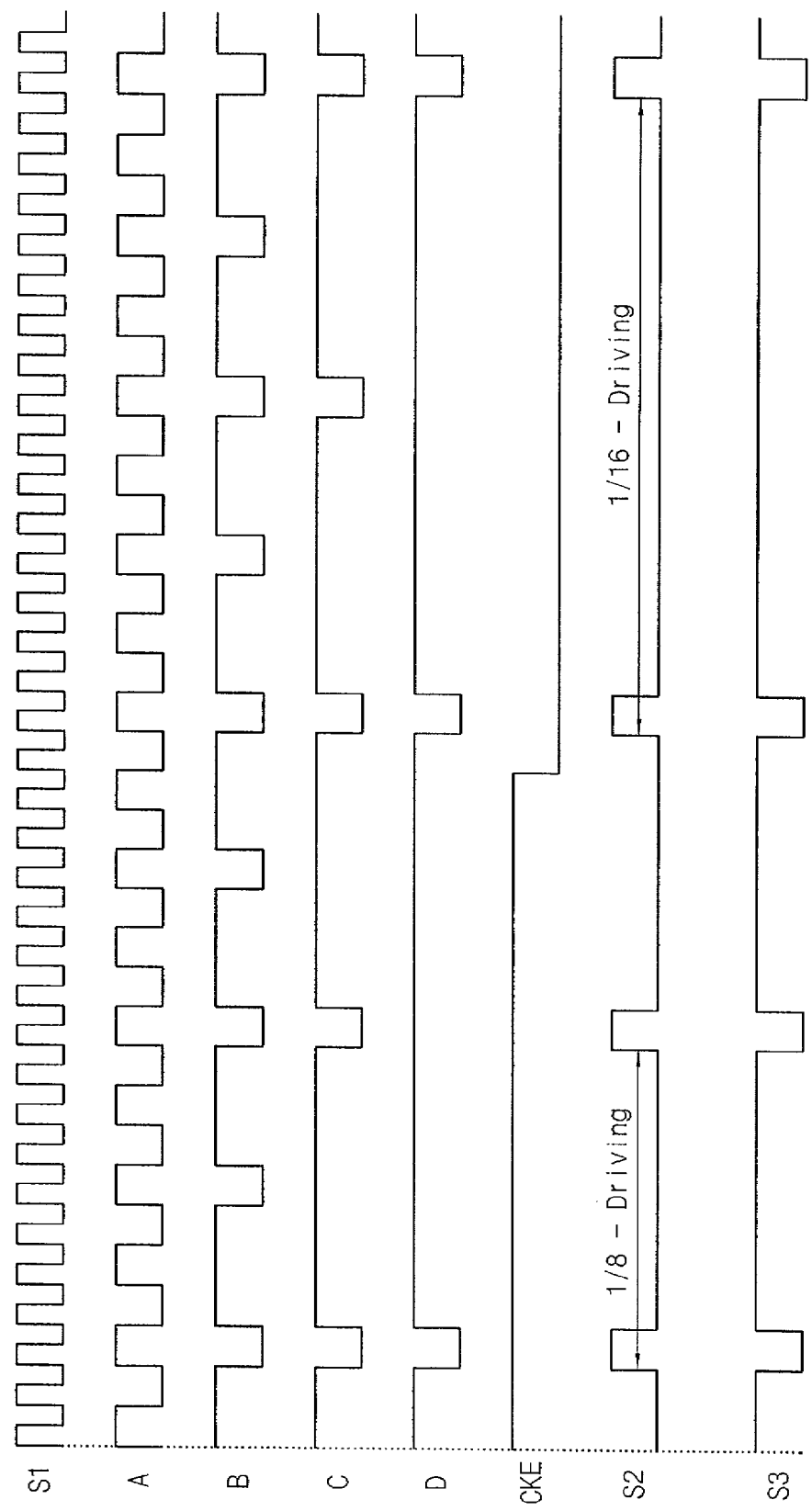
FIG. 5 is a timing diagram of the clock divider illustrated in FIG. 4.

As shown in FIGS. 4 and 5, the first divider 400 divides an input signal S1, and outputs a clock signal A having a frequency that is ½ of the frequency of the input signal. That is, the period of the output clock signal of the first divider is twice the period of the input clock signal of the first divider. Accordingly, the pulse width of the high-level state of the output signal of the first divider is the same as the period of the input clock signal of the first divider.

The second divider 410 divides the input clock signal A, and outputs a clock signal B having a frequency that is ½ of the frequency of the input clock signal. That is, the period of the output clock signal of the second divider is twice the period of the input clock signal of the second divider. As illustrated in FIGS. 4 and 5, the pulse width of the low-level state of the output signal of the second divider is the same as the period of the input clock signal of the first divider.

The third divider 420 divides the input clock signal B, and outputs a clock signal C having a frequency that is ½ of the frequency of the input clock signal. That is, the period of the output clock signal of the third divider is twice the period of the input clock signal of the third divider. As illustrated in FIGS. 4 and 5, the pulse width of the low-level state of the output signal of the third divider is the same as the period of the input clock signal of the first divider.

The fourth divider 430 divides the input clock signal C, and outputs a clock signal D having a frequency that is ½ of the frequency of the input clock signal. That is, the period of the output clock signal of the fourth divider is twice the period of the input clock signal of the fourth divider. As illustrated in FIGS. 4 and 5, the pulse width of the low-level state of the output signal of the fourth divider is the same as the period of the input clock signal of the first divider.

The power-down controller 500 receives the output clock signals of the third and fourth dividers 420 and 430, and selects and outputs one of the output clock signals of the third and fourth dividers according to the logic level of the clock enable signal CKE that is the control signal.

An example of the power-down controller is illustrated in FIG. 4. As illustrated, the power-down controller comprises two transmission gates 510 and 520. Each transmission gate is composed of a PMOS transistor and an NMOS transistor connected in parallel. The on/off operation of the transmission gate is controlled by the clock enable signal CKE. If one transmission gate is turned on, the other transmission gate is turned off. As illustrated in FIG. 4, the output clock signal of the third divider is applied to the transmission gate 510, and the output clock signal of the fourth divider is applied to the transmission gate 520. If the clock enable signal CKE that is the control signal is in a high level, the transmission gate 510 is turned on, and if the clock enable signal CKE is in a low level, the transmission gate 520 is turned on. Accordingly, in the case that the clock enable signal CKE is in the high level, the waveform of the output signal S3 of the power-down controller is the same as the waveform of the output clock signal C of the third divider. In the case that the clock enable signal CKE is in the low level, the waveform of the output signal S3 of the power-down controller is the same as the waveform of the output clock signal D of the fourth divider.

In the embodiment of the present invention, the clock divider comprises four dividers and a power-down controller. However, the number of dividers may be increased to more than 5, or may be decreased to 2 or 3 as needed.

As described above, the clock divider for a DLL circuit according to the present invention can selectively output one of the output clock signal C of the third divider and the output clock signal D of the fourth divider according to the clock enable signal that is the control signal. Accordingly, by applying the clock divider according to the present invention to a DLL circuit, the output signal of the third divider is selected in the same manner as the conventional clock divider in the case that the memory device is in the non-power-down mode, but the output signal of the fourth divider is selected in the case that the memory device is in the power-down mode in which the power consumption of the memory device is reduced, thereby reducing the current loss of the DLL circuit.

Although preferred embodiments of the present invention have been described for illustrative purposes, those skilled in the art will appreciate that various modifications, additions and substitutions are possible, without departing from the scope and spirit of the invention as disclosed in the accompanying claims.

I claim:

1. A synchronous memory device for synchronization of an external input clock with an internal input clock comprising:
a delay locked loop (DLL) having a clock divider comprising a plurality of clock signal dividers connected in series,
a power down controller determining a power down operation based at least on a predetermined state of a clock enable signal that controls whether the memory device excluding the DLL receives the external input clock and that is inputted to the DLL,
wherein the clock divider outputs a first clock signal being one of the output signals of the clock signal dividers excluding the last clock signal divider of the series when the synchronous memory device is in the non-power down operation,
wherein the clock divider outputs a second clock signal being an output signal of the last clock divider of the series when the synchronous memory device is in a power down operation, and
wherein a frequency of the first clock signal is higher than that of the second clock signal.

2. The synchronous memory device of claim 1, wherein the frequency of the first clock signal is 2M when the frequency of the second clock signal is M.

3. A synchronous memory device for synchronization of an external input clock with an internal input clock comprising:
a clock divider configured to divide a buffered external input clock and generate a first and second clock signals, wherein the first clock signal has higher frequency than the second clock signal;
a power down controller configured to output one of the first and second clock signals in response to a clock enable signal which controls whether the memory device excluding the delay locked loop receives the external input clock; and
the delay locked loop configured to receive the output of the power down controller to perform a delay-locking operation.

4. The synchronous memory device of claim 3, wherein the memory device is in a power down operation when the clock enable signal is disabled, and the memory device is in a non-power down operation when the clock enable signal is enabled.

5. The synchronous memory device of claim 1, wherein the clock enable signal is enabled in the non-power down operation and the clock enable signal is disabled in the power-down operation, and the power down controller comprises:
a first transmission gate receiving the clock enable signal and the first clock signal and outputting the first clock signal when the clock enable signal is enabled;
a second transmission gate receiving the clock enable signal and the second clock signal and outputting the second clock signal when the clock enable signal is disabled.

6. The synchronous memory device of claim 5, wherein the first transmission gate comprises a first PMOS transistor and a first NMOS transistor connected in parallel, the first PMOS transistor having a gate receiving an inverted clock enable signal and a first NMOS transistor having a gate receiving the clock enable signal, and wherein the second transmission gate comprises a second PMOS transistor and a second NMOS transistor, the second PMOS transistor having a gate receiving the clock enable signal and the second NMOS transistor having a gate receiving the inverted clock enable signal.

* * * * *